United States Patent
Lu et al.

(10) Patent No.: US 8,729,383 B2
(45) Date of Patent: May 20, 2014

(54) STACKED-LAYERED THIN FILM SOLAR CELL AND MANUFACTURING METHOD THEREOF

(75) Inventors: Chun-Hsiung Lu, Houli Township, Taichung County (TW); Chien-Chung Bi, Houli Township, Taichung County (TW)

(73) Assignee: Nexpower Technology Corp., Taichung County (TW)

( * ) Notice: Subject to any disclaimer, the term of this patent is extended or adjusted under 35 U.S.C. 154(b) by 1091 days.

(21) Appl. No.: 12/330,818

(22) Filed: Dec. 9, 2008

(65) Prior Publication Data

US 2009/0308448 A1    Dec. 17, 2009

(51) Int. Cl.
*H01L 31/05* (2014.01)

(52) U.S. Cl.
USPC .............. 136/249; 136/244; 136/256; 438/81

(58) Field of Classification Search
USPC ........ 136/249, 244, 255, 256; 438/57, 66, 68, 438/74
See application file for complete search history.

(56) References Cited

U.S. PATENT DOCUMENTS

| | | | |
|---|---|---|---|
| 4,668,840 A | 5/1987 | Kiyama et al. | |
| 5,021,099 A | 6/1991 | Kim et al. | |
| 5,603,778 A | 2/1997 | Sonoda et al. | |
| 5,853,497 A | 12/1998 | Lillington et al. | |
| 6,566,159 B2 | 5/2003 | Sawada et al. | |
| 6,632,993 B2 | 10/2003 | Hayashi et al. | |
| 6,870,088 B2 | 3/2005 | Tachibana et al. | |
| 2002/0066478 A1* | 6/2002 | Hayashi et al. | 136/244 |
| 2008/0083452 A1* | 4/2008 | Morooka et al. | 136/252 |
| 2008/0110491 A1* | 5/2008 | Buller et al. | 136/249 |
| 2009/0007955 A1* | 1/2009 | Nakashima et al. | 136/244 |

* cited by examiner

*Primary Examiner* — Jayne Mershon
(74) *Attorney, Agent, or Firm* — Ming Chow; Sinorica, LLC

(57) ABSTRACT

Disclosed are a stacked-layered thin film solar cell and a manufacturing method thereof. The stacked-layered thin film solar cell includes plural unit cells connected together electrically, each including a substrate, a first electrode layer, a first photoconductive layer, an interlayer, a second photoconductive layer and a second electrode layer, wherein the first electrode layer is divided by plural first grooves; plural second grooves are formed through the second photoconductive layer, the interlayer, and the first photoconductive layer; and plural third grooves are formed in the second electrode layer and extended downward through the first photoconductive layer. The first, second and third grooves are offset with respect to one another. The stacked-layered thin film solar cell is characterized by plural recesses formed at intersections between the interlayer and the second grooves for preventing leakage of electrical current from the first or second photoconductive layer to the interlayer through the second grooves.

15 Claims, 4 Drawing Sheets

STACKED-LAYERED THIN FILM SOLAR CELL AND MANUFACTURING METHOD THEREOF

BACKGROUND OF THE INVENTION

1. Technical Field

The present invention relates to a stacked-layered thin film solar cell and a manufacturing method thereof. More particularly, the present invention relates to an insulation structure in a stacked-layered thin film solar cell.

2. Description of Related Art

Please refer to FIG. 1A for a stacked-layered thin film solar cell in the prior art. As shown in the drawing, a stacked-layered thin film solar cell 1 comprises a substrate 14, a first electrode layer 11, a semiconductor layer 13 and a second electrode layer 12 stacked together. In a manufacturing process of the stacked-layered thin film solar cell 1, the substrate 14 is deposited with the first electrode layer 11, which is then treated with laser scribing to form a plurality of unit cells 112 divided by a plurality of grooves 111. Following that, the semiconductor layer 13 is deposited on the first electrode layer 11 and treated with laser scribing, so that each groove cut into the semiconductor layer 13 is approximately 100 μm from an adjacent groove 111 cut into the first electrode layer 11. Next, the second electrode layer 12 is deposited on the semiconductor layer 13, and the second electrode layer 12 and the semiconductor layer 13 are treated with laser scribing to form a plurality of grooves 121 cut into the second electrode layer 12 and the semiconductor layer 13, each of which grooves 121 is approximately 100 μm from an adjacent groove 131 cut into the semiconductor layer 13. Thus, by depositing the aforesaid layers and performing laser scribing thereon, the stacked-layered thin film solar cell 1 is formed with the plurality of unit cells 112 connected in series.

The photoelectric conversion efficiency of a stacked-layered thin film solar cell has its limit owing to such factors as recombination of electrons and electron holes and loss of light. Therefore, during the manufacturing process, an interlayer is often added between a material having a high energy level and a material having a low energy level, so that when light penetrates the stacked-layered thin film solar cell, a portion of the light that has relatively short wavelengths and can be absorbed by the material having the high energy level will be reflected, thereby increasing a light path. Meanwhile, a portion of the light that has relatively long wavelengths and cannot be absorbed by the material having the high energy level will reach the material having the lower energy level, thereby increasing light transmission. For instance, U.S. Pat. No. 5,021,100 discloses a stacked-layered thin film solar cell integrated with a dielectric selective reflection film. However, the interlayer, which serves to connect materials having different energy gaps, has a certain degree of electric conductivity and may cause current leakage or short circuit during an edge insulation treatment in the manufacturing process, Hence, referring to FIG. 1B, U.S. Pat. No. 6,632,993 adds circuit-breaking grooves 161 cut into an interlayer 16 for interrupting current flow in the interlayer 16 and thereby preventing current leakage. Referring now to FIG. 1C, U.S. Pat. No. 6,870,088 adopts a similar approach except that grooves 18 are cut into a photoelectric conversion layer and provided between two circuit-breaking grooves 171 to prevent the aforementioned problem. Although insulation can be achieved in the U.S. Pat. Nos. 6,632,993 and 6,870,088 by forming circuit-breaking grooves cut into specific layers, the additional processing steps and costs are disadvantageous to mass-production manufacturers. Therefore, it is a pressing issue to solve the short-circuit problem of the interlayer at a low production cost.

BRIEF SUMMARY OF THE INVENTION

In order to overcome the drawbacks of the prior art, the present invention provides a stacked-layered thin film solar cell comprising a plurality of unit cells connected together electrically. Each of the unit cells comprises a substrate, a first electrode layer, a first photoconductive layer, an interlayer, a second photoconductive layer and a second electrode layer sequentially stacked together, wherein a plurality of first grooves are formed in the first electrode layer; then a plurality of second grooves are formed through the second photoconductive layer, the interlayer and the first photoconductive layer; and then a plurality of third grooves are formed in the second electrode layer and extended downward through the first photoconductive layer. The first, second and third grooves are offset with respect to one another. The stacked-layered thin film solar cell is characterized by a plurality of recesses formed at intersections between the interlayer and the second grooves for preventing leakage of electrical current from the first photoconductive layer or the second photoconductive layer to the interlayer through the second grooves, and thereby avoiding short circuit.

Therefore, a primary objective of the present invention is to provide a stacked-layered thin film solar cell capable of preventing current leakage from the second grooves to the interlayer and thereby achieving excellent insulation effects.

The present invention further provides a method for manufacturing a stacked-layered thin film solar cell, comprising the steps of:

(1) providing a substrate;
(2) providing a first electrode layer on the substrate;
(3) forming a plurality of first grooves passing through the first electrode layer;
(4) providing a first photoconductive layer on the first electrode layer;
(5) providing an interlayer on the first photoconductive layer;
(6) providing a second photoconductive layer on the interlayer;
(7) forming a plurality of second grooves through the second photoconductive layer, the interlayer and the first photoconductive layer;
(8) forming a plurality of recesses at intersections between the interlayer and the second grooves by etching the interlayer through the second grooves;
(9) providing a second electrode layer on the second photoconductive layer; and
(10) forming a plurality of third grooves extending from the second electrode layer downward through the first photoconductive layer.

Another objective of the present invention is to provide a method for manufacturing a stacked-layered thin film solar cell, wherein recesses are formed at intersections between an interlayer and second grooves, in lieu of the insulating grooves formed in the prior art by cutting, so as to reduce production costs.

BRIEF DESCRIPTION OF THE SEVERAL VIEWS OF THE DRAWINGS

The invention as well as a preferred mode of use, further objectives and advantages thereof will be best understood by referring to the following detailed description of illustrative embodiments when read in conjunction with the accompanying drawings, wherein.

DETAILED DESCRIPTION OF THE INVENTION

The present invention discloses a stacked-layered thin film solar cell and a manufacturing method thereof. Since the principles of photoelectric conversion from solar energy employed in the present invention are well known to people of ordinary skill in the art, a detailed description of such principles will be omitted herein. Besides, the drawings referred to hereinafter are not, and need not be, drawn according to actual dimensions because they are intended to demonstrate structural features of the present invention only schematically.

Figure 1A:
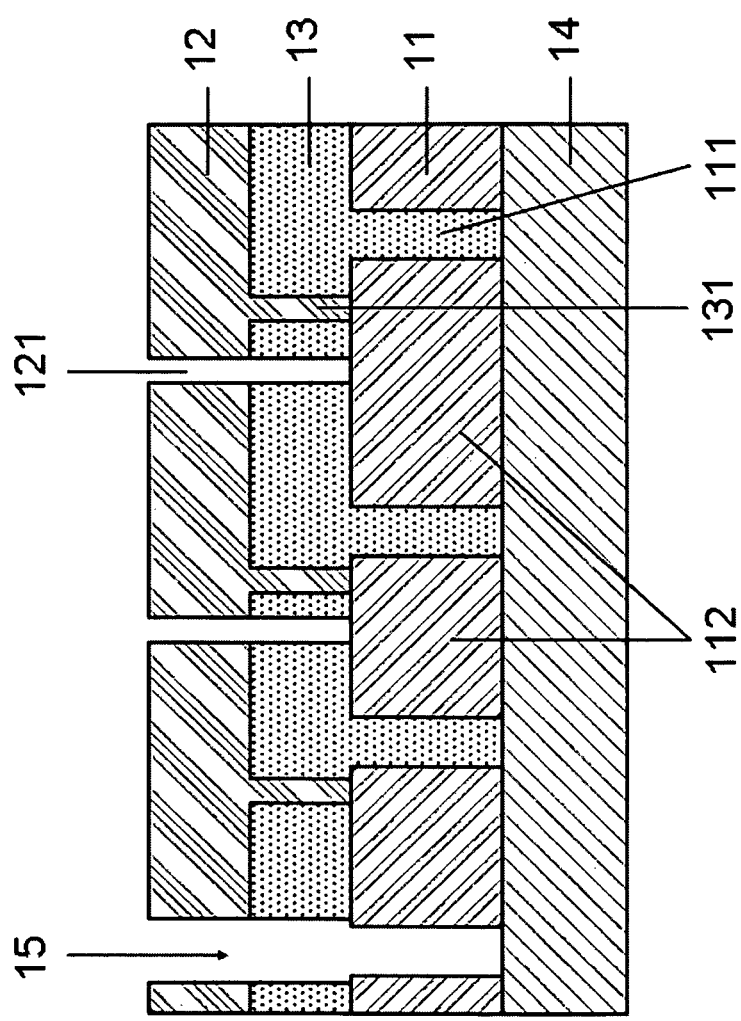
FIG. 1A is a schematic drawing of a conventional stacked-layered thin film solar cell.
Figure 1B:
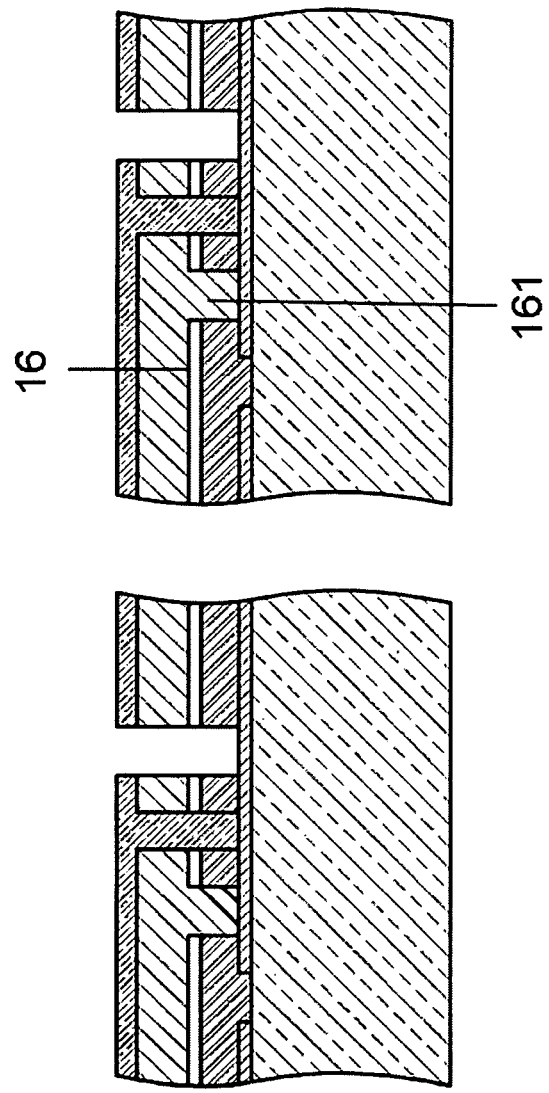
FIG. 1B is a schematic drawing of another conventional stacked-layered thin film solar cell.
Figure 1C:
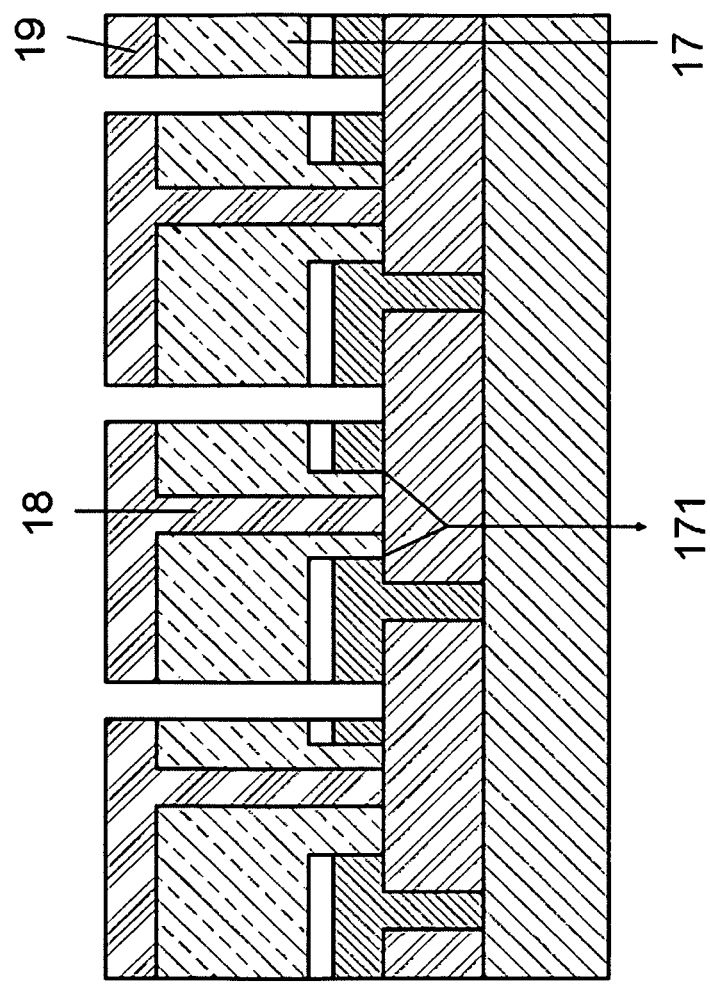
FIG. 1C is a schematic drawing of yet another conventional stacked-layered thin film solar cell.
Figure 2:
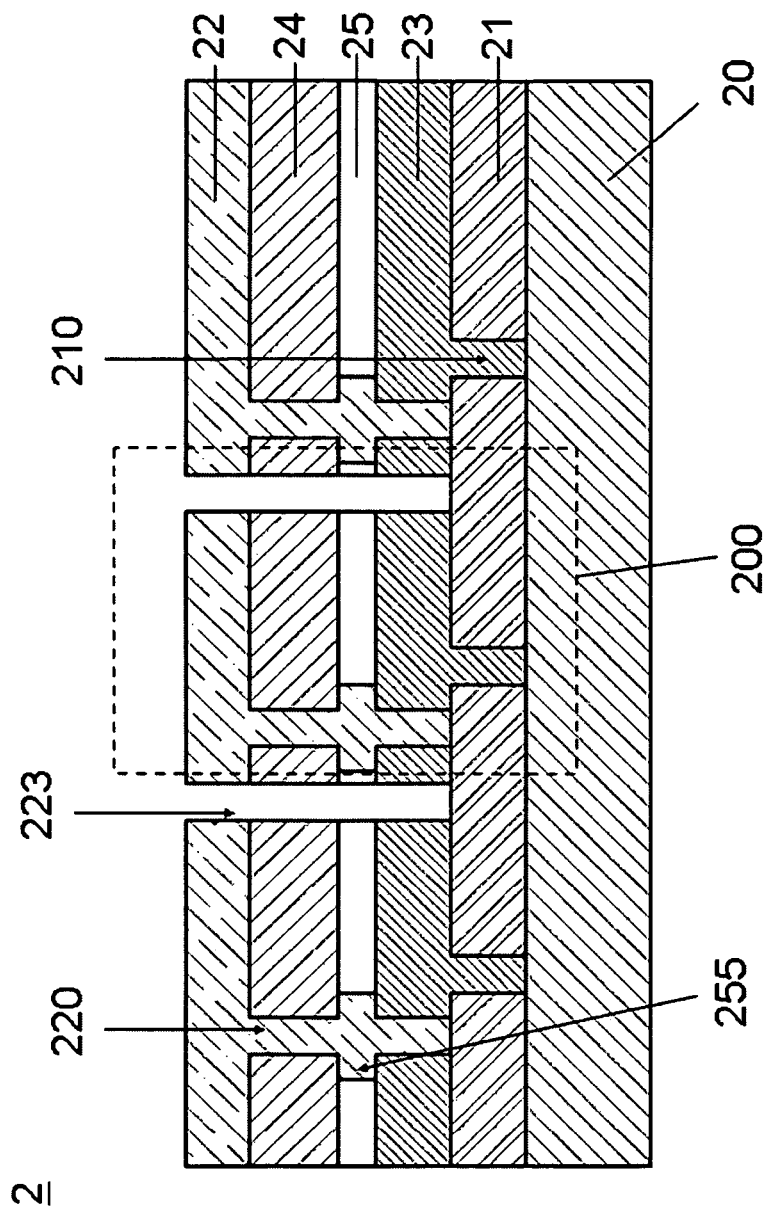
FIG. 2 is a schematic drawing of a stacked-layered thin film solar cell according to a first preferred embodiment of the present invention.

Referring to FIG. 2, a stacked-layered thin film solar cell 2 according to a first preferred embodiment of the present invention comprises a plurality of unit cells 200 connected together electrically. Each of the unit cells 200 comprises a substrate 20, a first electrode layer 21, a first photoconductive layer 23, an interlayer 25, a second photoconductive layer 24 and a second electrode layer 22 stacked sequentially together.

The unit cells 200 are electrically connected in a series connection, a parallel connection or a combination thereof.

The substrate 20 can be made of a transparent material.

The first electrode layer 21 can be made of a transparent conductive oxide (TCO) such as tin dioxide ($SnO_2$), indium tin oxide (ITO), zinc oxide (ZnO), aluminum zinc oxide (AZO), gallium-doped zinc oxide (GZO) or indium zinc oxide (IZO). In addition, the first electrode layer 21 can be formed on the substrate 20 by sputtering, atmospheric-pressure chemical vapor deposition (APCVD) or low-pressure chemical vapor deposition (LPCVD). The first electrode layer 21 can have a single-layered structure or a multi-layered structure, in which the fist electrode layer 21 may include a metal layer of a material selected from the group consisting of silver (Ag), aluminum (Al), chromium (Cr), titanium (Ti), nickel (Ni) and gold (Au).

The first photoconductive layer 23 can be made of monocrystalline silicon, polycrystalline silicon, amorphous silicon, microcrystalline silicon, germanium (Ge), silicon-germanium (SiGe) or silicon carbide (SiC). The first photoconductive layer 23 can be formed on the first electrode layer 21 through deposition.

The interlayer 25 can be made of titanium oxide (TiO), tin dioxide ($SnO_2$), indium tin oxide (ITO), zinc oxide (ZnO), aluminum zinc oxide (AZO), gallium-doped zinc oxide (GZO) or indium zinc oxide (IZO). The interlayer 25 can be formed on the first photoconductive layer 23 through deposition.

The second photoconductive layer 24 can be made of monocrystalline silicon, polycrystalline silicon, amorphous silicon, microcrystalline silicon, germanium (Ge), silicon-germanium (SiGe) or silicon carbide (SiC). The second photoconductive layer 24 can be formed on the interlayer 25 through deposition.

The second electrode layer 22 can be made of a transparent conductive oxide (TCO) such as tin dioxide ($SnO_2$), indium tin oxide (ITO), zinc oxide (ZnO), aluminum zinc oxide (AZO), gallium-doped zinc oxide (GZO) or indium zinc oxide (IZO). The second electrode layer 22 can have a single-layered structure or a multi-layered structure. In addition, the second electrode layer 22 can be formed on the second photoconductive layer 24 by sputtering or physical vapor deposition (PVD).

The second electrode layer 22 may include a metal layer of a material selected from the group consisting of silver (Ag), aluminum (Al), chromium (Cr), titanium (Ti), nickel (Ni) and gold (Au). The second electrode layer 22 may further include a transparent conductive oxide (TCO) selected from the group consisting of tin dioxide ($SnO_2$), indium tin oxide (ITO), zinc oxide (ZnO), aluminum zinc oxide (AZO), gallium-doped zinc oxide (GZO) and indium zinc oxide (IZO).

Sequentially formed in the stacked-layered thin film solar cell 2 are a plurality of first grooves 210 in the first electrode layer 21; a plurality of second grooves 220 through the second photoconductive layer 24, the interlayer 25 and the first photoconductive layer 23; and a plurality of third grooves 223 extending from the second electrode layer 22 through the first photoconductive layer 23, wherein the fist grooves 210, the second grooves 220 and the third grooves 223 are offset with respect to one another.

In order to improve insulation of a stacked-layered thin film solar cell, a conventional approach is to have circuit-breaking grooves cut therein to prevent the interlayer from short-circuiting. However, this approach adds more steps to the manufacturing process and may significantly increase the cost for manufactures having large production capacities. To solve this problem, according to the present invention, the plurality of recesses 255 are transversely formed in the interlayer 25 at the intersections of the interlayer 25 and the second grooves 220 by any one of various etching methods after the second grooves 220 are formed, so as to prevent leakage of electrical current from the first photoconductive layer 23 or the second photoconductive layer 24 to the interlayer 25 through the second grooves 220. Since the recesses 255 in the present invention are formed by etching and completed after the second grooves 220 are formed, a laser scribing step can be omitted from the manufacturing process. Besides, the recesses 255 provide better insulating effects than the circuit-breaking grooves in the prior art, so that insulation can be enhanced at a lower production cost.

The recesses 255 can be formed by various etching methods including a vapor etching method employing a vapor of hydrochloric acid, oxalic acid, sulfuric acid, acetic acid, hydrofluoric acid or nitric acid. The recesses 255 can have an average width ranging from 0.1 to 20 μm, with a maximum width preferably ranging from 1 to 10 μm.

The present invention further provides, as a second preferred embodiment thereof, a method for manufacturing a stacked-layered thin film solar cell 2, the method comprising the steps of:

(1) providing a substrate 20;

(2) providing a first electrode layer 21 on the substrate 20;

(3) forming a plurality of first grooves 210 passing through the first electrode layer 21;

(4) providing a first photoconductive layer 23 on the first electrode layer 21;

(5) providing an interlayer 25 on the first photoconductive layer 23;

(6) providing a second photoconductive layer 24 on the interlayer 25;

(7) forming a plurality of second grooves 220 through the second photoconductive layer 24, the interlayer 25 and the first photoconductive layer 23;

(8) forming a plurality of recesses 255 at intersections between the interlayer 25 and the second grooves 220 by etching the interlayer 25 through the second grooves 220;

(9) providing a second electrode layer 22 on the second photoconductive layer 24; and

(10) forming a plurality of third grooves 223 extending from the second electrode layer 22 downward through the first photoconductive layer 23.

The present invention uses the recesses 255 to prevent current leakage from the first photoconductive layer 23 or the second photoconductive layer 24 to the interlayer 25 through the second grooves 220. Since the recesses 255 are formed by etching, a laser scribing step can be omitted from the manufacturing process. Besides, the recesses 255 provide better insulating effects than the circuit-breaking grooves in the prior art, so that insulation can be enhanced at a lower production cost.

The recesses 255 can also be formed by a liquid etching method employing a liquid of hydrochloric acid, oxalic acid, sulfuric acid, acetic acid, hydrofluoric acid or nitric acid. The recesses 255 can have an average width ranging from 0.1 to 20 µm, with a maximum width preferably ranging from 1 to 10 µm. Other structural features of the second preferred embodiment are the same as those in the first preferred embodiment of the present invention.

The present invention has been described with reference to preferred embodiments thereof and it is understood that the embodiments are not intended to limit the scope of the present invention. Moreover, as the contents disclosed herein should be readily understood and can be implemented by a person skilled in the art, all equivalent changes or modifications which do not depart from the spirit of the present invention should be encompassed by the appended claims.

The invention claimed is:

1. A stacked-layered thin film solar cell, comprising a plurality of unit cells connected together electrically, each said unit cell comprising a substrate, a first electrode layer, a first photoconductive layer, an interlayer, a second photoconductive layer and a second electrode layer sequentially stacked together, wherein the stacked-layered thin film solar cell comprises a plurality of first grooves formed in the first electrode layer, a plurality of second grooves formed through the second photoconductive layer, the interlayer and the first photoconductive layer, and a plurality of third grooves formed in the second electrode layer and extended downward through the first photoconductive layer, in which the first, second and third grooves are offset with respect to one another, and wherein the stacked-layered thin film solar cell is characterized in:

the layer is transversely formed with a plurality of recesses at intersections of the interlayer and the plurality of second grooves for preventing leakage of electrical current from the first photoconductive layer or the second photoconductive layer to the interlayer through the second grooves, wherein the plurality of recesses is formed by an etching process after formation of the plurality of second grooves and each of the plurality of recesses have an average width ranging from 0.1 um to 20 um.

2. The stacked-layered thin film solar cell as claimed in claim 1, wherein the etching method is a vapor etching method.

3. The stacked-layered thin film solar cell as claimed in claim 2, wherein the vapor etching method uses a vapor of a substance selected from the group consisting of hydrochloric acid, oxalic acid, sulfuric acid, acetic acid, hydrofluoric acid and nitric acid.

4. The stacked-layered thin film solar cell as claimed in claim 1, wherein the etching method is a liquid etching method.

5. The stacked-layered thin film solar cell as claimed in claim 4, wherein the liquid etching method uses a liquid of a substance selected from the group consisting of hydrochloric acid, oxalic acid, sulfuric acid, acetic acid, hydrofluoric acid and nitric acid.

6. The stacked-layered thin film solar cell as claimed in claim 1, wherein the substrate is made of a transparent material.

7. The stacked-layered thin film solar cell as claimed in claim 1, wherein the first electrode layer is made of a transparent conductive oxide (TCO) selected from the group consisting of tin dioxide ($SnO_2$), indium tin oxide (ITO), zinc oxide (ZnO), aluminum zinc oxide (AZO), gallium-doped zinc oxide (GZO) and indium zinc oxide (IZO); and the second electrode layer comprises a metal layer of a material selected from the group consisting of silver (Ag), aluminum (Al), chromium (Cr), titanium (Ti), nickel (Ni) and gold (Au).

8. The stacked-layered thin film solar cell as claimed in claim 1, wherein the second electrode layer further comprises a transparent conductive oxide selected from the group consisting of tin dioxide ($SnO_2$), indium tin oxide (ITO), zinc oxide (ZnO), aluminum zinc oxide (AZO), gallium-doped zinc oxide (GZO) and indium zinc oxide (IZO).

9. The stacked-layered thin film solar cell as claimed in claim 1, wherein the second electrode layer is made of a transparent conductive oxide (TCO) selected from the group consisting of tin dioxide ($SnO_2$), indium tin oxide (ITO), zinc oxide (ZnO), aluminum zinc oxide (AZO), gallium-doped zinc oxide (GZO) and indium zinc oxide (IZO); and the first electrode layer comprises a metal layer of a material selected from the group consisting of silver (Ag), aluminum (Al), chromium (Cr), titanium (Ti), nickel (Ni) and gold (Au).

10. The stacked-layered thin film solar cell as claimed in claim 1, wherein the first electrode layer is formed on the substrate by a method selected from the group consisting of sputtering, atmospheric-pressure chemical vapor deposition (APCVD) and low-pressure chemical vapor deposition (LPCVD).

11. The stacked-layered thin film solar cell as claimed in claim 1, wherein the first electrode layer has one of a single-layered structure and a multi-layered structure.

12. The stacked-layered thin film solar cell as claimed in claim 1, wherein the first photoconductive layer is made of a material selected from the group consisting of monocrystalline silicon, polycrystalline silicon, amorphous silicon, microcrystalline silicon, germanium (Ge), silicon-germanium (SiGe) and silicon carbide (SiC).

13. The stacked-layered thin film solar cell as claimed in claim 1, wherein the interlayer is made of a material selected from the group consisting of titanium oxide (ITO), indium tin oxide (ITO), zinc oxide (ZnO), aluminum zinc oxide (AZO), gallium-doped zinc oxide (GZO) and indium zinc oxide (IZO).

14. The stacked-layered thin film solar cell as claimed in claim 1, wherein the second photoconductive layer is made of a material selected from the group consisting of monocrystalline silicon, polycrystalline silicon, amorphous silicon, microcrystalline silicon, germanium (Ge), silicon-germanium (SiGe) and silicon carbide (SiC).

15. The stacked-layered thin film solar cell as claimed in claim 1, wherein the second electrode layer is formed on the second photoconductive layer by a method selected from the group consisting of sputtering and physical vapor deposition (PVD).

\* \* \* \* \*